(12) United States Patent
Maes et al.

(10) Patent No.: US 10,204,782 B2
(45) Date of Patent: Feb. 12, 2019

(54) COMBINED ANNEAL AND SELECTIVE DEPOSITION PROCESS

(71) Applicants: ASM IP Holding B.V., Almere (NL); IMEC VZW, Leuven (BE)

(72) Inventors: Jan Willem Maes, Wilrijk (BE); Werner Knaepen, Leuven (BE); Roel Gronheid, Huldenberg (BE); Arjun Singh, Leuven (BE)

(73) Assignees: IMEC vzw, Leuven (BE); ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/132,091

(22) Filed: Apr. 18, 2016

(65) Prior Publication Data

US 2017/0301542 A1    Oct. 19, 2017

(51) Int. Cl.
| | |
|---|---|
| H01L 21/33 | (2006.01) |
| H01L 21/033 | (2006.01) |
| G03F 7/00 | (2006.01) |
| H01L 21/02 | (2006.01) |
| H01L 21/027 | (2006.01) |
| H01L 21/32 | (2006.01) |

(52) U.S. Cl.
CPC ........ H01L 21/0338 (2013.01); G03F 7/0002 (2013.01); H01L 21/0228 (2013.01); H01L 21/0273 (2013.01); H01L 21/02178 (2013.01); H01L 21/0332 (2013.01); H01L 21/0335 (2013.01); H01L 21/0337 (2013.01); H01L 21/32 (2013.01)

(58) Field of Classification Search
CPC .......................... H01L 21/31133; H01L 23/528
See application file for complete search history.

(56) References Cited

U.S. PATENT DOCUMENTS

| | | | |
|---|---|---|---|
| 4,863,879 | A | 9/1989 | Kwok |
| 4,948,755 | A | 8/1990 | Mo |
| 5,288,697 | A | 2/1994 | Schrepp et al. |
| 5,447,887 | A | 9/1995 | Filipiak et al. |
| 5,633,036 | A | 5/1997 | Seebauer et al. |
| 5,869,135 | A | 2/1999 | Vaeth et al. |
| 5,925,494 | A | 7/1999 | Horn |
| 6,046,108 | A | 4/2000 | Liu et al. |

(Continued)

FOREIGN PATENT DOCUMENTS

| | | |
|---|---|---|
| EP | 0469456 A1 | 2/1992 |
| EP | 0880168 A2 | 11/1998 |

(Continued)

OTHER PUBLICATIONS

Prasittichai et al., "Area Selective Molecular Layer Deposition of Polyurea Film", Applied Materials & Interfaces, 2013, vol. 5, pp. 13391-13396.

(Continued)

*Primary Examiner* — Caridad Everhart
*Assistant Examiner* — Ankush Singal
(74) *Attorney, Agent, or Firm* — Knobbe, Martens, Olson & Bear LLP

(57) ABSTRACT

A method for forming a film with an annealing step and a deposition step is disclosed. The method comprises an annealing step for inducing self-assembly or alignment within a polymer. The method also comprises a selective deposition step in order to enable selective deposition on a polymer.

24 Claims, 1 Drawing Sheet

(56) References Cited

U.S. PATENT DOCUMENTS

| | | |
|---|---|---|
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton et al. |
| 6,844,258 B1 | 1/2005 | Fair et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,754,621 B2 | 7/2010 | Putkonen |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,955,979 B2 | 6/2011 | Kostamo et al. |
| 7,964,505 B2 | 6/2011 | Khandelwal et al. |
| 8,293,597 B2 | 10/2012 | Raaijmakers |
| 8,293,658 B2 | 10/2012 | Shero et al. |
| 8,425,739 B1 * | 4/2013 | Wieting .......... H01L 31/022425 |
| | | 204/192.26 |
| 8,536,058 B2 | 9/2013 | Kostamo et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,490,145 B2 | 11/2016 | Niskanen et al. |
| 9,502,289 B2 | 11/2016 | Haukka et al. |
| 9,803,277 B1 | 10/2017 | Longrie et al. |
| 9,911,595 B1 | 3/2018 | Smith et al. |
| 2001/0019803 A1 | 9/2001 | Mirkanimi |
| 2001/0025205 A1 | 9/2001 | Chern et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0181035 A1 | 9/2003 | Yoon et al. |
| 2003/0192090 P1 | 10/2003 | Meilland |
| 2003/0193090 A1 | 10/2003 | Otani |
| 2004/0219746 A1 | 7/2004 | Vaartstra et al. |
| 2005/0136604 A1 | 6/2005 | Al-Bayati et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0141155 A1 | 6/2006 | Gordon et al. |
| 2006/0156979 A1 | 7/2006 | Thakur et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0063317 A1 | 3/2007 | Kim et al. |
| 2007/0099422 A1 | 5/2007 | Wijekoon et al. |
| 2007/0241390 A1 | 10/2007 | Tanaka et al. |
| 2008/0066680 A1 | 3/2008 | Sherman |
| 2008/0072819 A1 | 3/2008 | Rahtu |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 * | 11/2009 | Millward .......... B81C 1/00031 |
| | | 428/221 |
| 2009/0311879 A1 | 12/2009 | Blasco et al. |
| 2010/0015756 A1 | 1/2010 | Weidman et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2011/0053800 A1 * | 3/2011 | Jung .................... C12N 5/0068 |
| | | 506/14 |
| 2011/0124192 A1 | 5/2011 | Ganguli et al. |
| 2011/0221061 A1 | 9/2011 | Prakash |
| 2011/0311726 A1 | 12/2011 | Liu et al. |
| 2012/0032311 A1 | 2/2012 | Gates |
| 2012/0046421 A1 * | 2/2012 | Darling .................... C08F 8/42 |
| | | 525/371 |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0089983 A1 | 4/2013 | Sugita et al. |
| 2013/0095664 A1 | 4/2013 | Matero et al. |
| 2013/0115768 A1 | 5/2013 | Pore et al. |
| 2013/0146881 A1 | 6/2013 | Yamazaki et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 * | 7/2014 | Traser ........................ C09J 7/00 |
| | | 428/41.3 |
| 2014/0205766 A1 * | 7/2014 | Lyon ..................... G03F 7/0002 |
| | | 427/558 |
| 2014/0209022 A1 | 7/2014 | Inoue et al. |
| 2014/0227461 A1 | 8/2014 | Darwish et al. |
| 2014/0273290 A1 | 9/2014 | Somervell |
| 2014/0273514 A1 * | 9/2014 | Somervell .............. C23C 14/221 |
| | | 438/763 |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 * | 1/2015 | Kunimatsu ........ G02F 1/133723 |
| | | 438/30 |
| 2015/0037972 A1 | 2/2015 | Danek et al. |
| 2015/0064931 A1 | 3/2015 | Kumagi et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 * | 3/2016 | Chen ........................ C09D 5/00 |
| | | 521/153 |

(56) References Cited

U.S. PATENT DOCUMENTS

| | | | |
|---|---|---|---|
| 2016/0186004 A1* | 6/2016 | Hustad | C09D 153/00 427/379 |
| 2016/0222504 A1 | 8/2016 | Haukka et al. | |
| 2016/0247695 A1 | 8/2016 | Niskanen et al. | |
| 2016/0276208 A1 | 9/2016 | Haukka et al. | |
| 2016/0293398 A1 | 10/2016 | Danek et al. | |
| 2016/0365280 A1 | 12/2016 | Brink et al. | |
| 2017/0037513 A1 | 2/2017 | Haukka et al. | |
| 2017/0040164 A1 | 2/2017 | Wang et al. | |
| 2017/0058401 A1 | 3/2017 | Blackwell et al. | |
| 2017/0069527 A1 | 3/2017 | Haukka et al. | |
| 2017/0100742 A1 | 4/2017 | Pore et al. | |
| 2017/0100743 A1 | 4/2017 | Pore et al. | |
| 2017/0154806 A1 | 6/2017 | Wang et al. | |
| 2017/0298503 A1 | 10/2017 | Maes et al. | |
| 2017/0323776 A1 | 11/2017 | Färm et al. | |
| 2017/0352533 A1 | 12/2017 | Tois et al. | |
| 2017/0352550 A1 | 12/2017 | Tois et al. | |
| 2018/0233350 A1 | 8/2018 | Tois et al. | |

FOREIGN PATENT DOCUMENTS

| | | |
|---|---|---|
| EP | 1340269 | 2/2009 |
| JP | 2011-187583 | 9/2011 |
| JP | 2014-93331 | 5/2014 |
| KR | 102001001072 | 2/2001 |
| KR | 1020040056026 | 6/2004 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 15/047345 | 4/2015 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 17/184357 | 10/2017 |
| WO | WO 2017/184358 | 10/2017 |

OTHER PUBLICATIONS

Coclite, et al.; 25th Anniversary Article: CVD Polymers: A New Paradigm for Surface Modification and Device Fabrication; Advanced Materials; Oct. 2013; 25; pp. 5392-5423.

Farr, Isaac Vincent; Synthesis and Characterization of Novel Polyimide Gas Separation Membrane Material Systems, Chapter 2; Virginia Tech Chemistry PhD Dissertation; URN # etd-080999-123034; Jul. 26, 1999.

George, Steven M.; Atomic Layer Deposition: An Overview; Chem. Rev. 2010, 110, pp. 111-131; Feb. 12, 2009.

Norrman, et al.; 6 Studies of Spin-Coated Polymer Films; Annu. Rep. Prog. Chem.; Sect. C; 2005; 101; pp. 174-201.

Putkonen, et al.; Atomic Layer Deposition of Polyimide Thin Films; Journal of Materials Chemistry; 2007, 17, pp. 664-669.

Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.

Sapp, et al.; Thermo-Mechanical and Electrical Characterization of Through-Silicon Vias with a Vapor Deposited Polyimide Dielectric Liner; IEEE; 2012.

Sundberg, et al.; Organic and Inorganic-Organic Thin Film Structures by Molecular Layer Deposition: A Review; Beilstein J. Nanotechnol; 2014, 5, pp. 1104-1136.

Toirov, et al.; Thermal Cyclodehydration of Polyamic Acid Initiated by UV-Irradiation; Iranian Polymer Journal; vol. 5, No. 1; pp. 16-22; 1996; Iran.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

International Search Report and Written Opinion dated Jun. 16, 2017 in PCT/US2017/026518.

International Search Report and Written Opinion dated Jun. 20, 2017 in PCT/US2017/026515.

International Search Report and Written Opinion dated Jun. 22, 2017 in PCT/US2017/26519.

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly(methyl methacrylate) Films as Mask Layers, J. Phys. Chem. C, 2008, 112, pp. 15791-15795. (Year: 2008).

Ghosal et al., Controlling Atomic Layer Deposition of TiO2 in Aerogels through Surface Functionalization, Chem. Matter, vol. 21, pp. 1989-1992, 2009.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.

Lee et al., Area-Selective Atomic Layer Deposition Using Self-Assembled Monolayer and Scanning Probe Lithography, Journal of the Electrochemical Society, vol. 156, Issue 9, pp. G125-G128, 2009.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

(56) References Cited

OTHER PUBLICATIONS

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Low et al., Selective deposition of CVD iron on silicon dioxide and tungsten, Microelectronic Engineering 83, pp. 2229-2233, 2006.

Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high-purity Pt nanostructures by combining electron beam induced deposition and atomic layer deposition, Journal of Applied Physics, vol. 107, pp. 116102-1-116102-3, 2010.

Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.

Notice of Allowance dated Apr. 5, 2017 in U.S. Appl. No. 15/177,195.

Office Action dated Aug. 29, 2014 in U.S. Appl. No. 13/702,992.

Office Action dated Nov. 7, 2014 in U.S. Appl. No. 13/708,863.

Office Action dated Jun. 8, 2017 in Korean Application No. 2013-7000596.

Overhage et al., Selective Atomic Layer Deposition (SALD) of Titanium Dioxide on Silicon and Copper Patterned Substrates, Journal of Undergraduate Research 4, 29, Mar. 2011 in 4 pages.

Parulekar et al., Atomic Layer Deposition of Zirconium Oxide on Copper Patterned Silicon Substrate, Journal of Undergraduate Research, vol. 7, pp. 15-17, 2014.

Parulekar et al., Selective atomic layer deposition of zirconium oxide on copper patterned silicon substrate, pp. 1-6, 2013.

Proslier et al., "Atomic Layer Deposition and Superconducting Properties of NbSi Films", The Journal of Physical Chemistry C, 2011, vol. 115, No. 50, pp. 1-26.

Roberts et al., "Selective Mn deposition on Cu lines", poster presentation, 12th International Conference on Atomic Layer Deposition, Jun. 19, 2012, Dresden, Germany.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1 - 010601-4, Jan. 2014.

Senesky et al., "Aluminum nitride as a masking material for the plasma etching of silicon carbide structures," 2010, IEEE, pp. 352-355.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al. Area-selective atomic layer deposition of platinum using photosensitive polyimide. Nanotechnology 27 (2016) 405302 (6pp).

Suntola, "Handbook of Crystal Growth. vol. 3., Thin Films and Epitaxy, Part B: Growth mechanisms and Dynamics", Amsterdam: North Holland, Elsevier Science Publishers (1994), Chapter 14, pp. 601-663.

Chen et al. Highly Stable Monolayer Resists for Atomic Layer Deposition on Germanium and Silicon, Chem. Matter. 2006:18:3733-3741.

Mackus et al. The use of atomic layer deposition in advanced nanopatterning. Nanoscale, 2014, 6, pp. 10941-10960. (Year: 2014).

Schuisky et al. Atomic layer deposition of thin films using O2 as oxygen source. Langmuir, 2001, 17, pp. 5508-5512. (Year: 2001).

Bernal-Ramos, et al., "Atomic Layer Deposition of Cobalt Silicide Thin Films Studied by in Situ Infrared Spectroscopy", Chem. Mater. 2015, 27, pp. 4943-4949.

Ellinger et al., "Selective Area Spatial Atomic Layer Deposition of ZnO, Al2O3, and Aluminum-Doped ZnO Using Poly(vinyl pyrrolidone)", Chem Mater. 2014, 26:1514-1522.

\* cited by examiner

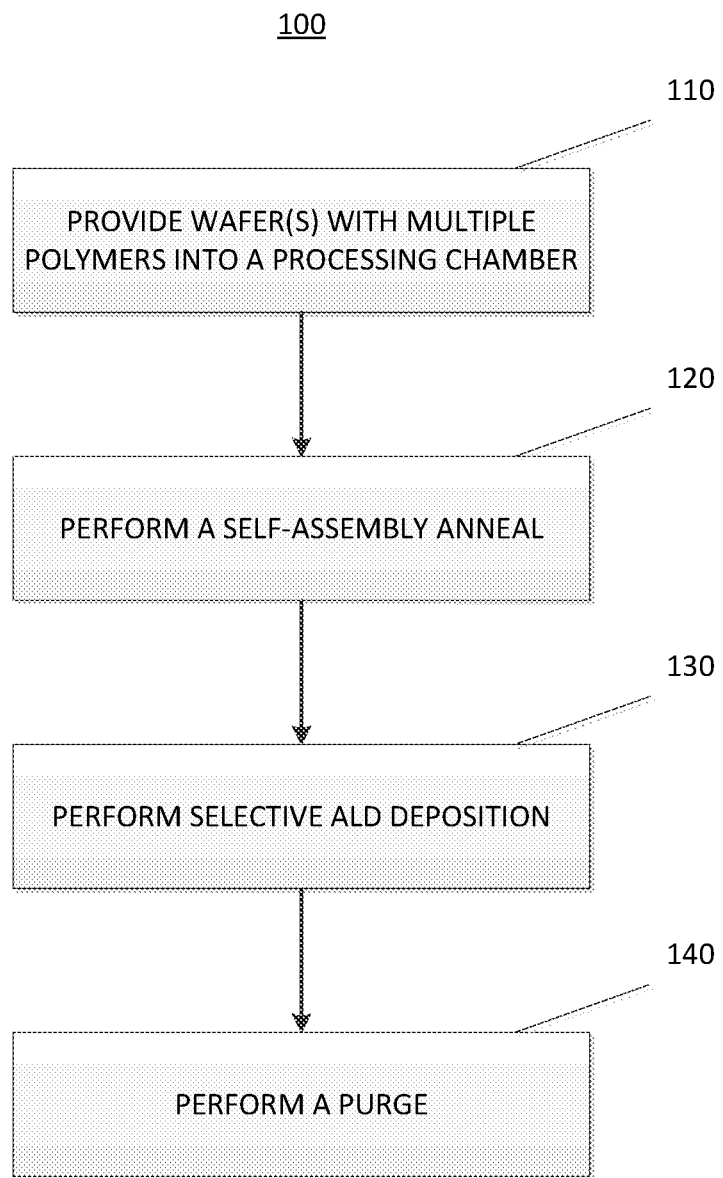

COMBINED ANNEAL AND SELECTIVE DEPOSITION PROCESS

CROSS-REFERENCE TO RELATED APPLICATION

This application is related to U.S. Non-Provisional patent application Ser. No. 15/132,084, filed Apr. 18, 2016 and entitled "COMBINED ANNEAL AND SELECTIVE DEPOSITION SYSTEMS," and U.S. Provisional Patent Application 62/324,255, filed Apr. 18, 2016 and entitled "METHOD OF FORMING A DIRECTED SELF-ASSEMBLED LAYER ON A SUBSTRATE," the disclosures of which are hereby incorporated by reference in their entireties.

FIELD

The present disclosure generally relates to processes and systems for manufacturing electronic devices. More particularly, the disclosure relates to selective deposition of films. Specifically, the disclosure may disclose methods and systems to selectively form films using a directed self-assembly (DSA) patterning technique.

BACKGROUND

As the trend has pushed semiconductor devices to smaller and smaller sizes, different patterning techniques have arisen. These techniques include spacer defined quadruple patterning, extreme ultraviolet lithography (EUV), and EUV combined with Spacer Defined Double patterning. These approaches have allowed production of nodes in the 7 nm range.

Directed self-assembly (DSA) has been considered as an option for future lithography applications. DSA involves the use of block copolymers to define patterns for self-assembly. The block copolymers used may include poly(methyl methacrylate) (PMMA), polystyrene, or poly(styrene-block-methyl methacrylate) (PS-b-PMMA). Other block copolymers may include emerging "high-Chi" polymers, which may potentially enable small dimensions.

DSA can be used to form parallel lines or regular arrays of holes/pillars/posts with very small pitch and critical dimensions. In particular, DSA can define sub-20 nm patterns through self-assembly, while guided by surface topography and/or surface chemical patterning. As a result, a DSA polymer layer can be infiltrated with a precursor, or a film may be deposited selectively on one of the polymers of the DSA layers.

However, the DSA technique has several drawbacks. In particular, DSA polymers, such as PMMA or polystyrene, have low etch resistance. This makes the transfer of the pattern to layers below more difficult. The issue of low etch resistance becomes greater when the advanced polymers needed to further downscale the size of the semiconductor device has an even lower etch resistance and etch selectivity. In addition, the DSA may result in a high line edge roughness in the obtained patterns. Another drawback is that the obtained structure of parallel lines or array of holes may have some defects at random locations.

As a result, a method for selectively forming a film with higher etching resistance and etching selectivity is desired.

SUMMARY

In accordance with at least one embodiment of the invention, a method to selectively form a film is disclosed. The method comprises: providing a substrate for processing in a reaction chamber, the substrate having at least one polymer layer disposed on the substrate; performing an annealing step on the substrate; and performing a film deposition by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber; wherein a film forms on the at least one polymer from the first precursor.

In accordance with at least one embodiment of the invention, a method for selectively forming a film is disclosed. The method may comprise: providing a substrate for processing in a reaction chamber, the substrate having at least one polymer layer disposed on the substrate; performing a film deposition by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber; and performing an annealing step on the substrate; wherein a film forms on the at least one polymer from the first precursor.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached FIGURES, the invention not being limited to any particular embodiment(s) disclosed.

BRIEF DESCRIPTION OF THE DRAWINGS

These and other features, aspects, and advantages of the invention disclosed herein are described below with reference to the drawings of certain embodiments, which are intended to illustrate and not to limit the invention.

FIG. 1 is a flowchart of a method in accordance with at least one embodiment of the invention.

It will be appreciated that elements in the figures are illustrated for simplicity and clarity and have not necessarily been drawn to scale. For example, the dimensions of some of the elements in the FIGURES may be exaggerated relative to other elements to help improve understanding of illustrated embodiments of the present disclosure.

DETAILED DESCRIPTION

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Embodiments in accordance with the invention relate to the combination of DSA techniques with selective deposition. This combination can increase the etch resistance of polymers significantly. Selective deposition allows for particular polymers to be reacted with a precursor gas, while leaving other polymers untouched.

Combining selective deposition with DSA patterning may provide benefits previously unseen with prior approaches, such as the one described in US Patent Publication No. US 2014/0273514 A1. For example, a selective deposition of aluminum oxide ($Al_2O_3$) at 90° C. may allow the reaction with a PMMA polymer, while leaving a polystyrene polymer untouched. The aluminum oxide will not only deposit on top of the PMMA polymer, but may be infused into the PMMA polymer to increase the rigidity of the PMMA polymer.

FIG. 1 illustrates a method 100 in accordance with at least one embodiment of the invention. The method 100 includes a first step 110 of providing a wafer with multiple polymers in a processing chamber. As described above, the wafer may have at least a first DSA polymer and a second DSA polymer, wherein the first DSA polymer and the second DSA polymer may be made of PMMA, polystyrene (PS), among other polymers. The processing chamber may be a batch reactor or a cluster tool with two batch reactors. One example of a potential processing chamber may include an A412 system from ASM International N.V., which may run in two reactor chambers the same process or run two different processes independently or sequentially.

The method 100 may include a second step 120 of performing a self-assembly anneal of the DSA polymers. The purpose of the annealing process is to incite the self-assembly or self-organization in the DSA polymers or the block copolymer. In other words, parallel lines or grids of holes/pillars/posts in the polymers may be formed as directed by guidance structures on the substrate. In accordance with at least one embodiment of the invention, this may mean that domains of PMMA and domains of PS may be formed in an alternating manner. The benefits achieved by the self-assembly anneal may include improvement of the self-assembly process, reduction of defects, improved line width roughness, and improved critical dimension (CD) uniformity. Alternatively, the anneal of the second step 120 may have a purpose of degassing moisture or other contaminants from the polymer, hardening the polymer, or selectively burning away one of the polymer types from the substrate surface.

In order to reach a low defect density in the obtained pattern, process parameters, such as the time, temperature, and the ambient conditions and pressure of the annealing process, are critical. A long annealing time may be needed to obtain a low defect density. The anneal may take place at a temperature ranging between 100° C. and 400° C., preferably between 200° C. and 300° C., and most preferably 250° C., for about 60 minutes. Other temperatures and durations are possible depending on the amount of anneal desired. However, the temperature of the self-assembly anneal should not be increased too high or the polymers may start to decompose.

The ambient environment in which the annealing is done may comprise nitrogen, argon, helium, hydrogen, oxygen, ozone, water vapor, solvent vapors, or mixtures of these gases. The pressure of the anneal ambient environment can be any pressure in the range from ultra-high vacuum to atmospheric pressure or even above atmospheric pressure.

In accordance with one embodiment of the invention, the annealing process may take place on a single wafer hot plate. In accordance with another embodiment of the invention, a batch reactor may prove to be beneficial for processes needing a long anneal time. The batch reactor may hold between 2 and 250 substrates, preferably between 5 and 150 substrates, or most preferably about 100 substrates. For example, the A412 may be operated such that one reactor may be used for an anneal process. This may enable to perform long anneals on the order of 1-2 hours in a cost effective way.

The method 100 may also include a third step 130 of performing a selective deposition of a metal or a dielectric film on top of either the first DSA polymer or the second DSA polymer. As such, the selective deposition may be done in a way that the deposited film may react selectively with only one of the two polymers. For example, the selective deposition may take place such that the deposited film may react with PMMA polymer and not PS polymer. In accordance with at least one embodiment of the invention, the third step 130 may comprise an atomic layer deposition of the metal or dielectric film.

Furthermore, the selective deposition may be done such that the deposited metal or dielectric film may infiltrate a polymer, while also depositing a second film on the whole volume of the polymer domain. In accordance with at least one embodiment of the invention, the third step 130 may take place in one reactor of an A412 system, such that the second step 120 takes place in the other reactor of the A412 system. It may also be possible that the second step 120 and the third step 130 take place in one single reactor of the A412 system.

The metal or dielectric deposited in the third step 130 may comprise aluminum oxide ($Al_2O_3$), silicon dioxide ($SiO_2$), silicon nitride (SiN), silicon oxycarbide (SiOC), silicon carbonitride (SiCN), aluminum nitride (AlN), titanium nitride (TiN), tantalum nitride (TaN), tungsten (W), cobalt (Co), titanium dioxide ($TiO_2$), tantalum oxide ($Ta_2O_5$), zirconium dioxide ($ZrO_2$), or hafnium dioxide ($HfO_2$). In order to perform the selective deposition, precursors to obtain the metal may be used, such as trimethylaluminum (TMA) and water ($H_2O$) for the formation of $Al_2O_3$.

The selective deposition in the third step 130 may take place at a temperature ranging between 25° C. and 300° C., with a preferable temperature range of 70° C.-90° C. for the formation of $Al_2O_3$. The temperature during the third step 130 may be less than the temperature during the second step 120, so a cooldown step may be needed to go from an example annealing temperature of 250° C. to a third step 130 temperature of 70° C. In accordance with at least one embodiment of the invention, a temperature of the second step 120 is at least 25° C. higher than that of the third step 130, preferably between 25° C.-300° C. higher than that of the third step 130, or more preferably between 100° C.-250° C. higher than that of the third step 130.

The third step 130 may comprise a first pulse of a first precursor, such as TMA, for a duration ranging from 30 seconds to 10 minutes. The third step 130 may also then comprise a purge for a duration ranging from 10 to 60 seconds. The third step 130 may then comprise a pulse of a second precursor, such as water, for a duration ranging from 10 to 60 seconds. The third step 130 may then comprise a second purge having a duration ranging from 10 seconds to 2 minutes. In addition, the third step 130 may be repeated as needed in order to obtain sufficient deposition of the metal.

In accordance with at least one embodiment of the invention, the third step 130 of film deposition may precede the second step 120 of annealing. In this case, the metal or dielectric film may first infiltrate the polymer, and then an annealing process may occur. As a result of the annealing process, polymer that did not react with the metal or dielectric film during the third step 130 may be burned away in the second step 120.

The method 100 may also include a fourth step 140 of purging the precursors. The fourth step 140 may involve introduction of a purge gas such as nitrogen, helium, argon, and other inert gases. The purge gas would remove excess precursor from the fourth step 140 from the processing chamber. The fourth step 140 may take place at a temperature similar to those of the third step 130.

In accordance with at least one embodiment of the invention, the third step 130 may be repeated as necessary in order to allow the precursors to infiltrate into the DSA polymer. The cycle may be repeated approximately 5 times to ensure sufficient amount of the metal or dielectric film in the DSA polymer. In each cycle, the time duration of the third step 130 may be on the order of a few minutes. With these time durations, a batch reactor may be used to achieve high productivity and low process costs by processing up to 100 wafers or more at a time.

In accordance with at least one embodiment of the invention, the method 100 may be operated such that the third step 130 may be repeated in a pulse-purge-pulse-purge manner. The conditions of these steps may be set at higher pressure and a longer time in order to allow the precursors to infiltrate the polymers. A single cycle in this manner may range between 1 and 20 minutes in duration. The cycle may be repeated several times, typically five times, in order to obtain sufficient deposition of the material inside the polymer. Because infiltration of the material inside the polymer may take a longer amount of time, a combined annealing and deposition process provides an opportunity to perform steps in a batch manner.

A potential application for use of a combined annealing and selective deposition process may be for extreme ultraviolet (EUV) photoresist. The annealing for a EUV application may not be for the self-assembly of the polymer, but may serve a curing or stabilizing purpose. For example, the combined annealing and selective deposition process in accordance with at least one embodiment of the invention may assist in the sequential infiltration synthesis (SIS) step as potentially preventing conversion of carboxyl groups, or by degassing moisture from the polymer film or by stabilizing or hardening the photoresist.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various FIGURES are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A method of selectively forming a film comprising:
providing a substrate for processing in a reaction chamber, the substrate having at least one polymer layer disposed on the substrate;
performing an annealing step on the substrate; and
performing a film deposition at a temperature lower than a temperature of the annealing step by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber;
wherein a film forms on the at least one polymer from the first precursor; and
wherein the film deposition comprises:
pulsing the first precursor onto the substrate;
purging the first precursor from the reaction chamber;
pulsing the second precursor onto the substrate; and
purging the second precursor from the reaction chamber.

2. The method of claim 1, wherein a film forms within the at least one polymer from the first precursor that infiltrates the at least one polymer.

3. The method of claim 1, wherein the film comprises at least one of: aluminum oxide ($Al_2O_3$), silicon dioxide ($SiO_2$), silicon nitride (SiN), silicon oxynitride (SiON), silicon carbonitride (SiCN), aluminum nitride (AlN), titanium nitride (TiN), tantalum nitride (TaN), tungsten (W), cobalt (Co), titanium dioxide ($TiO_2$), tantalum oxide ($Ta_2O_5$), zirconium dioxide ($ZrO_2$), or hafnium dioxide ($HfO_2$).

4. The method of claim 2, wherein the film comprises at least one of: aluminum oxide ($Al_2O_3$), silicon dioxide ($SiO_2$), silicon nitride (SiN), silicon oxynitride (SiON), silicon carbonitride (SiCN), aluminum nitride (AlN), titanium nitride (TiN), tantalum nitride (TaN), tungsten (W), cobalt (Co), titanium dioxide ($TiO_2$), tantalum oxide ($Ta_2O_5$), zirconium dioxide ($ZrO_2$), or hafnium dioxide ($HfO_2$).

5. The method of claim 1, wherein during the annealing step, a temperature of the reaction chamber ranges between 100° C. and 400° C.

6. The method of claim 1, wherein during the film deposition, the temperature of the reaction chamber ranges between 25° C. and 300° C.

7. The method of claim 1, wherein the at least one polymer comprises at least one of:
poly(methyl methacrylate) (PMMA), polystyrene, poly(styrene-block-methyl methacrylate) (PS-b-PMMA), or an extreme UV photoresist.

8. The method of claim 1, wherein the substrate comprises a second polymer.

9. The method of claim 8, wherein the second polymer comprises at least one of:
poly(methyl methacrylate) (PMMA), polystyrene, poly(styrene-block-methyl methacrylate) (PS-b-PMMA), or an extreme UV photoresist.

10. The method of claim 1, wherein purging the excess of the first precursor comprises purging the reaction chamber with at least one of: nitrogen ($N_2$), argon (Ar), helium (He), or an inert gas.

11. The method of claim 1, wherein the performing the film deposition step is repeated in order to form the film of a greater thickness with each repetition.

12. The method of claim 1, wherein the annealing step and the film deposition take place within a single reaction chamber.

13. A method of selectively forming a film comprising:
providing a substrate for processing in a reaction chamber, the substrate having at least one polymer layer disposed on the substrate;
performing an annealing step on the substrate; and
performing a film deposition by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber; wherein a film forms on the at least one polymer from the first precursor, and wherein the annealing step and the film deposition take place within different reaction chambers located on the same cluster tool.

14. The method of claim 1, wherein the reaction chamber is a batch system for processing substrates.

15. The method of claim 1, wherein the reaction chamber is configured to process multiple substrates.

16. The method of claim 1, wherein the annealing step is configured to induce self-assembly within the at least one polymer layer.

17. The method of claim 1, wherein the temperature of the annealing step is at least 25° C. higher than the temperature of the film deposition.

18. A method of selectively forming a film comprising:
providing a substrate for processing in a reaction chamber, the substrate having at least one polymer layer disposed on the substrate;
performing a film deposition by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber; and
after performing the film deposition, performing an annealing step on the substrate at a temperature higher than a temperature of the film deposition;
wherein a film forms on the at least one polymer from the first precursor; and
wherein the film deposition comprises:
pulsing the first precursor onto the substrate;
purging the first precursor from the reaction chamber;
pulsing the second precursor onto the substrate; and
purging the second precursor from the reaction chamber.

19. The method of claim 18, wherein the annealing step and the film deposition take place within a single reaction chamber.

20. A method of selectively forming a film comprising:
providing a substrate for processing in a reaction chamber, the substrate having at least one polymer layer disposed on the substrate;
performing a film deposition by sequentially pulsing a first precursor and a second precursor onto the substrate, the film deposition being configured to enable infiltration of at least the first precursor into the at least one polymer layer, wherein an excess of the first precursor and the second precursor are purged from the reaction chamber; and
after performing the film deposition, performing an annealing step on the substrate, wherein a film forms on the at least one polymer from the first precursor, wherein the annealing step and the film deposition take place within different reaction chambers located on the same cluster tool.

21. The method of claim 18, wherein the reaction chamber is a batch system for processing substrates.

22. The method of claim 18, wherein the reaction chamber is configured to process multiple substrates.

23. The method of claim 18, wherein the annealing step is configured to induce self-assembly within the at least one polymer layer.

24. The method of claim 18, wherein the temperature of the annealing step is at least 25° C. higher than the temperature of the film deposition.

* * * * *